United States Patent
Athalye et al.

(10) Patent No.: US 9,335,531 B2
(45) Date of Patent: May 10, 2016

(54) LED LIGHTING USING SPECTRAL NOTCHING

(75) Inventors: Praneet Athalye, Morrisville, NC (US); Gerald H. Negley, Chapel Hill, NC (US); Antony Paul van de Ven, Hong Kong (CN)

(73) Assignee: Cree, Inc., Durham, NC (US)

(*) Notice: Subject to any disclaimer, the term of this patent is extended or adjusted under 35 U.S.C. 154(b) by 315 days.

(21) Appl. No.: 13/341,337

(22) Filed: Dec. 30, 2011

(65) Prior Publication Data
US 2013/0170199 A1    Jul. 4, 2013

(51) Int. Cl.
*F21V 9/02*        (2006.01)
*A01M 1/04*      (2006.01)
(Continued)

(52) U.S. Cl.
CPC ............ *G02B 19/0066* (2013.01); *F21K 9/135* (2013.01); *F21V 3/04* (2013.01); *F21V 3/0418* (2013.01); *F21V 7/22* (2013.01); *G02B 5/20* (2013.01); *G02B 5/223* (2013.01); *G02B 5/28* (2013.01); *G02B 19/0009* (2013.01); *G02B 19/0028* (2013.01); *G02B 19/0061* (2013.01); *F21K 9/56* (2013.01); *F21V 3/0436* (2013.01); *F21V 3/0481* (2013.01); *F21V 7/005* (2013.01); *F21V 7/06* (2013.01); *F21V 9/16* (2013.01); *F21V 29/87* (2015.01); *F21V 29/89* (2015.01);
(Continued)

(58) Field of Classification Search
CPC ......... F21K 9/13; F21K 9/135; F21K 9/1355; F21K 9/137; F21K 9/1375
USPC .......... 362/2, 84, 166, 293, 311.02, 510, 800; 257/98, 100
See application file for complete search history.

(56) References Cited

U.S. PATENT DOCUMENTS 5,252,887 A * 10/1993 Reisman ........................ 313/112
6,600,175 B1    7/2003 Baretz et al.
(Continued)

FOREIGN PATENT DOCUMENTS

EP        2489717 A1    8/2012
JP        05-290818 A   11/1993
(Continued)

OTHER PUBLICATIONS

Cree, Inc., International Application No. PCT/US2012/070269, International Search Report and Written Opinion, Feb. 26, 2013.
(Continued)

*Primary Examiner* — Peggy Neils
*Assistant Examiner* — Alexander Garlen
(74) *Attorney, Agent, or Firm* — Withrow & Terranova, P.L.L.C.; Vincent K. Gustafson

(57) ABSTRACT

LED lighting using optical elements with spectral notching is disclosed. Embodiments of the invention provide an optical element and LED devices and systems using such an optical element, where spectral notch filtering introduced by the optical element improves the color rendering index (CRI) of emitted light. In some embodiments of the invention, the optical element is made to act as a notch filter by including a rare earth compound such as neodymium oxide in or on the material of which the optical element is made. A color pigment can also be used to impart notch-filtering properties to an optical element. An optical interference film can also be used. The optical element may be included in an LED device such as a multichip component or may be used as an enclosure or reflector for an LED lighting system such as a lamp or fixture.

61 Claims, 12 Drawing Sheets

(51) Int. Cl.

| | | |
|---|---|---|
| F21L 19/00 | (2006.01) | |
| F21V 9/00 | (2015.01) | |
| F21V 11/00 | (2015.01) | |
| F21V 3/00 | (2015.01) | |
| F21V 5/00 | (2015.01) | |
| H01L 33/00 | (2010.01) | |
| G02B 19/00 | (2006.01) | |
| G02B 5/20 | (2006.01) | |
| G02B 5/22 | (2006.01) | |
| G02B 5/28 | (2006.01) | |
| F21K 99/00 | (2016.01) | |
| F21V 3/04 | (2006.01) | |
| F21V 7/22 | (2006.01) | |
| F21V 7/00 | (2006.01) | |
| F21V 7/06 | (2006.01) | |
| F21V 9/16 | (2006.01) | |
| F21Y 101/02 | (2006.01) | |
| H01L 25/075 | (2006.01) | |
| H01L 33/58 | (2010.01) | |
| F21V 29/87 | (2015.01) | |
| F21V 29/89 | (2015.01) | |

(52) U.S. Cl.
CPC ......... F21Y 2101/02 (2013.01); H01L 25/0753 (2013.01); H01L 33/58 (2013.01); H01L 2224/48091 (2013.01); H01L 2224/48137 (2013.01); H01L 2924/1305 (2013.01); Y10T 29/49002 (2015.01)

(56) References Cited

U.S. PATENT DOCUMENTS

| | | | |
|---|---|---|---|
| 6,639,360 B2 | 10/2003 | Roberts et al. | |
| 6,717,732 B2* | 4/2004 | Meyr et al. | 359/584 |
| 6,737,681 B2* | 5/2004 | Koda | 257/98 |
| 6,744,194 B2 | 6/2004 | Fukasawa et al. | |
| 6,888,173 B2 | 5/2005 | Ishii et al. | |
| 6,940,101 B2* | 9/2005 | Yano et al. | 257/98 |
| 7,063,996 B2 | 6/2006 | Ishii et al. | |
| 7,141,442 B2 | 11/2006 | Sano | |
| 7,168,833 B2* | 1/2007 | Schottland et al. | 362/510 |
| 7,213,940 B1 | 5/2007 | Van De Ven et al. | |
| 7,658,866 B2* | 2/2010 | Murazaki et al. | 252/301.4 R |
| 7,937,865 B2 | 5/2011 | Li et al. | |
| 7,988,318 B1 | 8/2011 | Smith et al. | |
| 8,008,845 B2 | 8/2011 | Van De Ven et al. | |
| 8,258,722 B2 | 9/2012 | Swoboda et al. | |
| 8,575,836 B2 | 11/2013 | van de Ven | |
| 8,596,821 B2 | 12/2013 | Brandes et al. | |
| 2004/0201990 A1 | 10/2004 | Meyer | |
| 2004/0222726 A1 | 11/2004 | Lamouri et al. | |
| 2005/0275937 A1 | 12/2005 | Wu et al. | |
| 2006/0071589 A1 | 4/2006 | Radkov | |
| 2007/0240346 A1 | 10/2007 | Li et al. | |
| 2007/0241657 A1 | 10/2007 | Radkov et al. | |
| 2007/0267976 A1* | 11/2007 | Bohler et al. | 315/112 |
| 2008/0013316 A1* | 1/2008 | Chiang | 362/264 |
| 2008/0173884 A1 | 7/2008 | Chitnis et al. | |
| 2008/0179611 A1 | 7/2008 | Chitnis et al. | |
| 2008/0191609 A1 | 8/2008 | Schmidt et al. | |
| 2008/0266884 A1* | 10/2008 | Bogner et al. | 362/373 |
| 2009/0184616 A1 | 7/2009 | Van De Ven et al. | |
| 2009/0184618 A1 | 7/2009 | Hakata et al. | |
| 2009/0290348 A1* | 11/2009 | Van Laanen | H05K 1/0203 362/249.02 |
| 2010/0155763 A1 | 6/2010 | Donofrio et al. | |
| 2010/0213881 A1* | 8/2010 | Imai | 315/363 |
| 2010/0244740 A1 | 9/2010 | Alpert et al. | |
| 2011/0180780 A1 | 7/2011 | Yoo et al. | |
| 2011/0227102 A1 | 9/2011 | Hussell et al. | |
| 2011/0299284 A1 | 12/2011 | Van De Ven et al. | |
| 2012/0040585 A1 | 2/2012 | Huang | |
| 2012/0155061 A1 | 6/2012 | Manabe et al. | |
| 2012/0306355 A1 | 12/2012 | Seibel, II | |
| 2013/0170199 A1 | 7/2013 | Athalye et al. | |
| 2013/0271991 A1 | 10/2013 | Hussell et al. | |

FOREIGN PATENT DOCUMENTS

| | | |
|---|---|---|
| JP | 2004080046 A | 3/2004 |
| JP | 2007173557 A | 7/2007 |
| WO | 2012011279 A1 | 1/2012 |
| WO | 2012031533 A1 | 3/2012 |

OTHER PUBLICATIONS

Cho, Y., et al., Optical properties of neodymium-containing polymethylmethacrylate films for the organic light emitting diode color filter, Applied Physics Letters, 2006, pp. 051102-1-051102-3, vol. 89, No. 051102.

Sohn, S.H., et al., Optical properties of the neodymium-containing transparent dielectrics for plasma display panel, Applied Physics Letters, Oct. 21, 2002, pp. 3179, 3181, vol. 81, No. 17.

Lee, D.K., et al., Optical properties of inorganic $(SIO_2)_{1-x}(Nd_2O_3)_x$ alloy films for the color filter of plasma display panel, Applied Physics Letters, Feb. 11, 2002, pp. 983-985, vol. 80, No. 6.

Cree, Inc., Lighting the LED Revolution, Get High Efficacy and Low System Cost for the Smallest LED Systems with Cree XLamp High Voltage LEDs, 2011.

Cree, Inc., Cree XLamp XT-E HVW LEDs, Product Family Data Sheet, 2011, pp. 1-9.

Cree, Inc., Cree XLamp XP-G LEDs, Product Family Data Sheet, 2009-2011, pp. 1-12.

Cree, Inc., Cree XLamp MT-G EasyWhite LEDs, Product Family Data Sheet/Binning and Labeling Document, 2011, pp. 1-16.

Orion Telescopes & Binoculars, SkyGlow & UltraBlock Light-Pollution Filters.

Osram Opto Semiconductors, Oslon Black Series, Aug. 25, 2011, pp. 1-23.

Rugate Technologies, Inc., Products and Sales, http://www.rugate.com/products.html, accessed Dec. 9, 2011.

U.S. Appl. No. 13/017,407, filed Jan. 31, 2011.

U.S. Appl. No. 13/017,502, filed Jan. 31, 2011.

U.S. Appl. No. 13/235,103, filed Sep. 16, 2011.

U.S. Appl. No. 13/235,127, filed Sep. 16, 2011.

International Preliminary Report on Patentability for PCT/US2012/070269 mailed Jul. 1, 2014, 5 pages.

Author Unknown, "Interference Filters & Special Filters," Description—2013, Schott North America, Inc., Retrieved on Apr. 6, 2015 from http://www.schott.com/advanced_optics/english/download/schott_interference_filters_descript_2013_eng.pdf, 36 pages.

U.S. Appl. No. 14/259,943, filed Apr. 23, 2014.

U.S. Appl. No. 14/259,890, filed Apr. 23, 2014.

Author Unknown, "69204—LED11DA19RVL/TP: GE LED A19 Features & Photos," GE Lighting Product Catalog for consumers, retrieved Jan. 20, 2015 from http://genet.gelighting.com/LightProducts/Dispatcher?REQUEST=CONSUMERSPECPAGE&PRODUCTCODE=69204, 1 page.

Author Unknown, "69204—LED11DA19RVL/TP: GE LED A19 Technical Specifications," GE Lighting Product Catalog for consumers, retrieved Jan. 20, 2015 from http://genet.gelighting.com/LightProducts/Dispatcher?REQUEST=CONSUMERSPECPAGE&PRODUCTCODE=69204&TABID=2&BreadCrumbValues=&ModelSelectionFilter=, 1 page.

Author Unknown, "CALiPER Retail Lamps Study 3," Solid-State Lighting Program, Feb. 2014, Pacific Northwest National Laboratory, U.S. Department of Energy, 48 pages.

Houser, Kevin et al., "Review of measures for light-source color rendition and considerations for a two-measure system for characterizing color rendition," Optics Express, vol. 21, No. 8, Apr. 2013, 19 pages.

Kim, Ilku et al., "Wide Color Gamut Backlight from Three-band White LED," Journal of the Optical Society of Korea, vol. II, No. 2, Jun. 2007, pp. 67-70.

(56) References Cited

OTHER PUBLICATIONS

Rea, Mark S., "Value Metrics for Better Lighting," vol. PM228, Dec. 17, 2012, SPIE Press, 10 pages.
Smet, Kevin et al., "Correlation between color quality metric predictions and visual appreciation of light sources," Optics Express, vol. 19, No. 9, Apr. 2011, 16 pages.
Non-Final Office Action for U.S. Appl. No. 14/259,890, mailed Jul. 16, 2015, 7 pages.
Advisory Action, Examiner-Initiated Interview Summary and AFCP 2.0 Decision for U.S. Appl. No. 14/259,890, mailed Mar. 16, 2016, 5 pages.
Final Office Action for U.S. Appl. No. 14/259,890, mailed Jan. 6, 2016, 9 pages.

* cited by examiner

LED LIGHTING USING SPECTRAL NOTCHING

BACKGROUND

Light emitting diode (LED) lighting systems are becoming more prevalent as replacements for existing lighting systems. LED systems are an example of solid state lighting (SSL) and have advantages over traditional lighting solutions such as incandescent and fluorescent lighting because they use less energy, are more durable, operate longer, can be combined in multi-color arrays that can be controlled to deliver virtually any color light, and generally contain no lead or mercury. A solid state lighting system may take the form of a lighting unit, light fixture, light bulb, or a "lamp."

An LED lighting system may include, for example, a packaged light emitting device including one or more light emitting diodes (LEDs), which may include inorganic LEDs, which may include semiconductor layers forming p-n junctions and/or organic LEDs (OLEDs), which may include organic light emission layers. Light perceived as white or near-white may be generated by a combination of red, green, and blue ("RGB") LEDs. Output color of such a device may be altered by separately adjusting supply of current to the red, green, and blue LEDs. Another method for generating white or near-white light is by using a lumiphor such as a phosphor. Still another approach for producing white light is to stimulate phosphors or dyes of multiple colors with an LED source. Many other approaches can be taken.

An LED lamp may be made with a form factor that allows it to replace a standard incandescent bulb, or any of various types of fluorescent lamps. LED lamps often include some type of optical element or elements to allow for localized mixing of colors, collimate light, or provide a particular light pattern. Sometimes the optical element also serves as an envelope or enclosure for the electronics and or the LEDs in a lamp. LED lamps and LED light fixtures can used either transmissive optical elements or reflective optical elements. For example, a so-called "troffer" style ceiling fixture includes a reflector that serves and an optical element, and in some circumstances may include additional optical elements such as glass plates or lenses.

Color reproduction can be an important characteristic of any type of artificial lighting, including LED lighting. Color reproduction is typically measured using the color-rendering index (CRI). The CRI is a relative measurement of how the color rendition of an illumination system compares to that of a theoretical blackbody radiator. In practical terms, the CRI is a relative measure of the shift in surface color of an object when lit by a particular source. The CRI equals 100 if the color coordinates of a set of test surfaces being illuminated by the lamp are the same as the coordinates of the same test surfaces being irradiated by the theoretical blackbody radiator. Daylight has the highest CRI (100), with incandescent bulbs being relatively close, and fluorescent lighting being less accurate (70-85). Certain types of specialized lighting, such as mercury vapor and sodium lights exhibit a relatively low CRI (as low as about 40 or even lower).

An LED lamp or fixture may need to be self-contained. In such a case, a power supply is included in the lamp structure or fixture along with the LEDs or LED packages and the optical components. A heatsink is also often needed to cool the LEDs and/or power supply in order to maintain appropriate operating temperature. The power supply and especially the heatsink can often block some of the light coming from the LEDs in at least one direction. If the bulb of fixture is intended as a replacement for a traditional bulb or fixture, this blocking of light can cause the solid-state system to emit light in a pattern that is substantially different than the light pattern produced by the traditional light source. Optical elements for solid state lighting systems are sometimes shaped or placed to compensate for such effects.

SUMMARY

Embodiments of the invention provide an optical element, LED devices and LED lighting systems (lamps and/or fixtures) using such an optical element, where spectral notch filtering introduced by the optical element improves the color-rendering index (CRI) of the light. Warm white light created by a combination of LEDs and/or phosphor may be either under-saturated with certain colors of the spectrum or oversaturated with certain colors. In some devices, fixtures, and/or lamps, notch filtering according to example embodiments of the invention can be used to alleviate oversaturation, thereby improving the CRI of the device and/or system.

In some embodiments, an optical element is shaped to affect at least some light from at least one LED. The optical element filters the light so that the light passing through or reflected by the optical element exhibits a spectral notch after being affected by the optical element. In some embodiments, the spectral notch occurs between the wavelengths of 520 nm and 605 nm in the visible spectrum. In some embodiments, the spectral notch occurs between the wavelengths of 565 nm and 600 nm. In some embodiments, the spectral notch occurs between the wavelengths of 570 nm and 595 nm. In some embodiments, the optical element is made to act as a notch filter by including a rare earth compound in or on the material of which the optical element is made. The rare earth compound can be, for example, neodymium oxide. In some embodiments, the rare earth compound can be any or a combination of neodymium oxide, didymium, dysprosium, erbium, holmium, praseodymium and thulium. In some embodiments, particularly in reflective applications where the optical element is a reflector, the optical element can be made to act like a notch filter by coating the optical element with an optical interference film or causing optical interference in some other way. A color pigment can also be added to an optical element to impart notch filtering properties to the optical element.

In some embodiments, the notch-filtering optical element is used in a device with a plurality of interconnected LED chips. In some such embodiments, the optical element is shaped and positioned to affect the light from the LED chips by notch-filtering the spectrum of light emitted from the LED chips. In some embodiments, at least some of the LED chips include an associated phosphor to provide wavelength conversion. This phosphor can be packaged or encapsulated with a chip in a package with a small lens or window, or can be applied to the die as a coating. The combination of multiple interconnected LED chips, phosphor and a notch filtering optical element enables a light source in some embodiments with a CRI of at least about 84. In some embodiments, the light source has a CRI of at least about 89. In some embodiments, the light source has a CRI of at least about 91. Such an LED device can be embodied in a lamp, a lamp component, or multichip device.

In some embodiments, an LED lighting system makes use of spectral notching. The lighting system may be configured as an LED lamp. Such an LED lamp can include an LED array operable to emit light when energized through an electrical connection and an optical enclosure that is transmissive of the light while notch filtering the light. A lamp according to at least some embodiments also includes a power supply or driver to supply power to the LED array through the electrical connection. A phosphor may again be used to provide wavelength conversion. The phosphor may be locally associated with one or more LED chips as previously described, or may be associated with all the LED chips in the LED array by being remotely located on the enclosure or a carrier within the system. In some embodiments, the enclosure can be filled with an optically transmissive, fluid medium in thermal communication with the LED array. The fluid medium can cool the LED chips and in some embodiments the driver, to enable construction of a lamp with smaller components or without a heatsink to obstruct light.

In some embodiments the lighting system is configured as an LED light fixture with a reflector as at least one of the optical elements. For example, the fixture can hang suspended from a ceiling or be installed in a drop ceiling. Such a fixture could be any shape or size. In some example embodiments, a linear fixture such as a troffer fixture can be used. In some embodiments, the reflector is coated with a layer that includes a rare earth compound of one the types already discussed. The rare earth compound can be introduced into the reflector in other ways, for example, by impregnating particulate into the surface or doping the material of which the reflector is made. A color pigment can also be used instead of or in addition to the rare earth compound. An optical interference film coating can also be used to introduce notch filtering in a reflector. A system according to some embodiments of the invention may have a CRI of at least about 84, in some embodiments, a CRI of at least about 89, and in some embodiments, a CRI of at least about 91, whether the system is configured as a lamp or a fixture.

An LED device according to example embodiments of the invention can be assembled by selecting a plurality of LED chips based on desired light output characteristics, interconnecting the LED chips and attaching the notch-filtering optical element to the device. In some embodiments, phosphor is included. In some embodiments, the optical element is made by adding a rare earth compound or color pigment as previously described to plastic, glass, silicone or other material. The rare earth compound can be disbursed in the material or applied in the form of a coating, or by any other means.

In some embodiments, a lighting system such as a lamp or fixture can assembled by providing an optical element to notch filter the spectrum of light emitted by the LED array. A power supply is also provided and connected. Phosphor and/or an optically transmissive fluid medium can also optionally be included. Glass, silicone, plastic, paper or other materials with a rare earth compound or an optical interference film can be used.

Embodiments of the invention can include an LED system including at least one LED and an optical element that affects the light such that the light intensity is reduced within a predetermined portion of a visible spectrum of light emitted by the system. An LED system can be a lamp, a fixture, a multi-chip component, or any portion or combination of the forgoing. An optical element for such a system can be reflective or transmissive. An optical element can be said to affect the light from an LED even if the light has been effectively wavelength converted by a phosphor prior to interacting with the optical element or if a combination of light from at least one LED and at least one phosphor is used. When an LED system according to example embodiments of the invention is operated an LED or LEDs and a phosphor or phosphors are energized and the visible light intensity if filtered so that the intensity is comparatively reduced within a predetermined part of the visible spectrum. The term comparatively reduced means reduced relative to the output of the same or similar system without an optical element with notch filtering qualities. The effect is to increase the CRI in such as system. In some embodiments, the increase can be at least four points.

In some embodiments of an LED system, the light intensity is comparatively reduced by a peak of about 75%. In some embodiments, the light intensity is comparatively reduced by a peak of about 50%. In some embodiments, the light intensity is comparatively reduced by a peak amount between about 5% and about 100%. In some embodiments, the full width of a spectral notch corresponding to the comparative reduction at half the maximum is about 10 nm and wherein the color rendering index (CRI) of the LED system is at least about 84. In some embodiments, the full width of a spectral notch corresponding to the comparative reduction at half the maximum is about 20 nm and wherein the color rendering index (CRI) of the LED system is at least about 91. In some embodiments, a center wavelength for the spectral notch is between 580 and 600 nm. In some embodiments, the comparative reduction at half the maximum is between 10 and 20 nm and the center wavelength for the notch is between about 520 and about 605 nm. The notch can exhibit a predetermined shape profile.

DETAILED DESCRIPTION

Figure 1:
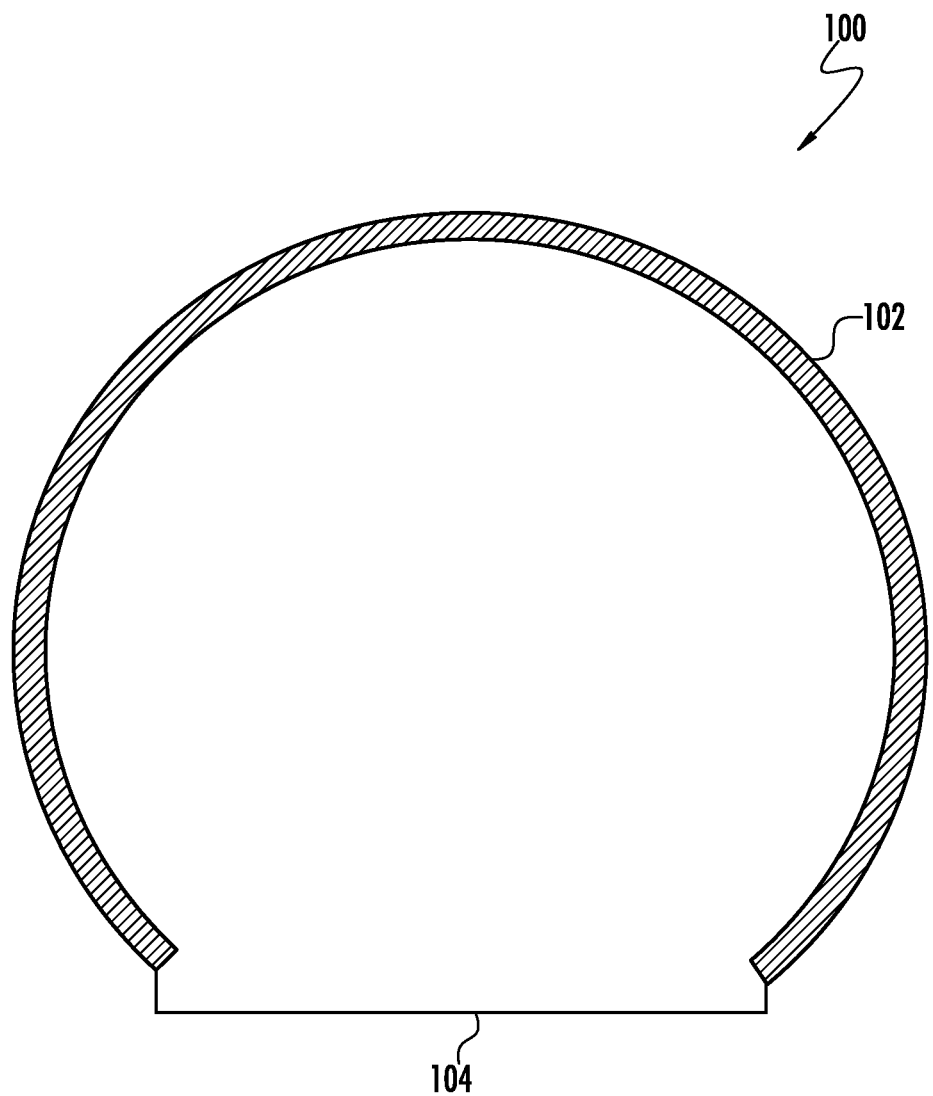
FIG. 1 is a cross-sectional view of a transmissive optical element according to some example embodiments of the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Unless otherwise expressly stated, comparative, quantitative terms such as "less" and "greater", are intended to encompass the concept of equality. As an example, "less" can mean not only "less" in the strictest mathematical sense, but also, "less than or equal to."

Embodiments of the invention provide an optical element, LED devices and LED systems such as lamps and fixtures, where spectral notch filtering introduced by the optical element improves the color-rendering index (CRI) of the emitted light. Warm white light created by a combination of LEDs and/or phosphor may be either under-saturated with certain colors of the spectrum or oversaturated with certain colors. In some devices and/or systems, notch filtering according to example embodiments of the invention can be used to alleviate oversaturation, thereby improving the CRI of the device and/or system. The optical element may take the form of a lens for a component of a lamp, a "globe" or external enclosure for a lamp, a reflector, or any other optical portion of a device or apparatus.

Notch-filtering light emitted from an incandescent filament has been used in conventional incandescent bulbs to create a more pleasing, daylight-like color for the emitted light. However, in incandescent bulbs, the notch filtering actually reduces the CRI of the bulb. The idea of using notch filtering to increase CRI in other types of lighting is counter-intuitive to its effect in incandescent lighting. Additionally, with solid-state lighting such as LED lighting, there is a general desire to maximize the light transmission of optical components to obtain the highest possible efficiency. Applying any optical filter to an LED lighting system reduces total output at least to some extent and more significantly reduces output at and around the center frequency of the notch. These effects run counterintuitive to using optical notch-filtering in LED lighting systems.

FIG. 1 is a cross-sectional view of an optical element according to some embodiments of the invention. Optical element 100 includes a dome-shaped form 102, made of glass, which has been doped with a rare earth compound, in this example, neodymium oxide, schematically indicated by the dotted pattern within the thickness of the glass. Such an optical element could also be made of a polymer, including an aromatic polymer such as an inherently UV stable polyester. In use, optical element 100 is part of a lamp so that an LED assembly resides at, just inside, or near the opening 104. The thickness of the dome portion of the optical element as shown in FIG. 1 as well as the thicknesses and sizes of portions of all the drawings herein may be exaggerated for clarity. Such features are not necessarily shown to scale in any of the drawings.

The optical element FIG. 1 is transmissive of light. However, due to the neodymium oxide in the glass, light passing through the dome of the optical element is filtered so that the light exiting the dome exhibits a spectral notch. A spectral notch is a portion of the color spectrum where the light is attenuated, thus forming a "notch" when light intensity is plotted against wavelength. Depending on the type or composition of glass or other material used to form the optical element, the amount of neodymium compound present, and the amount and type of other trace substances in the optical element, the spectral notch can occur between the wavelengths of 520 nm and 605 nm. In some embodiments, the spectral notch can occur between the wavelengths of 565 nm and 600 nm. In other embodiments, the spectral notch can occur between the wavelengths of 570 nm and 595 nm. A reflector may also serve as a notch-filtering optical element for a lighting system. Such a reflector is discussed later herein with respect to FIGS. 7 and 8.

Figure 2:
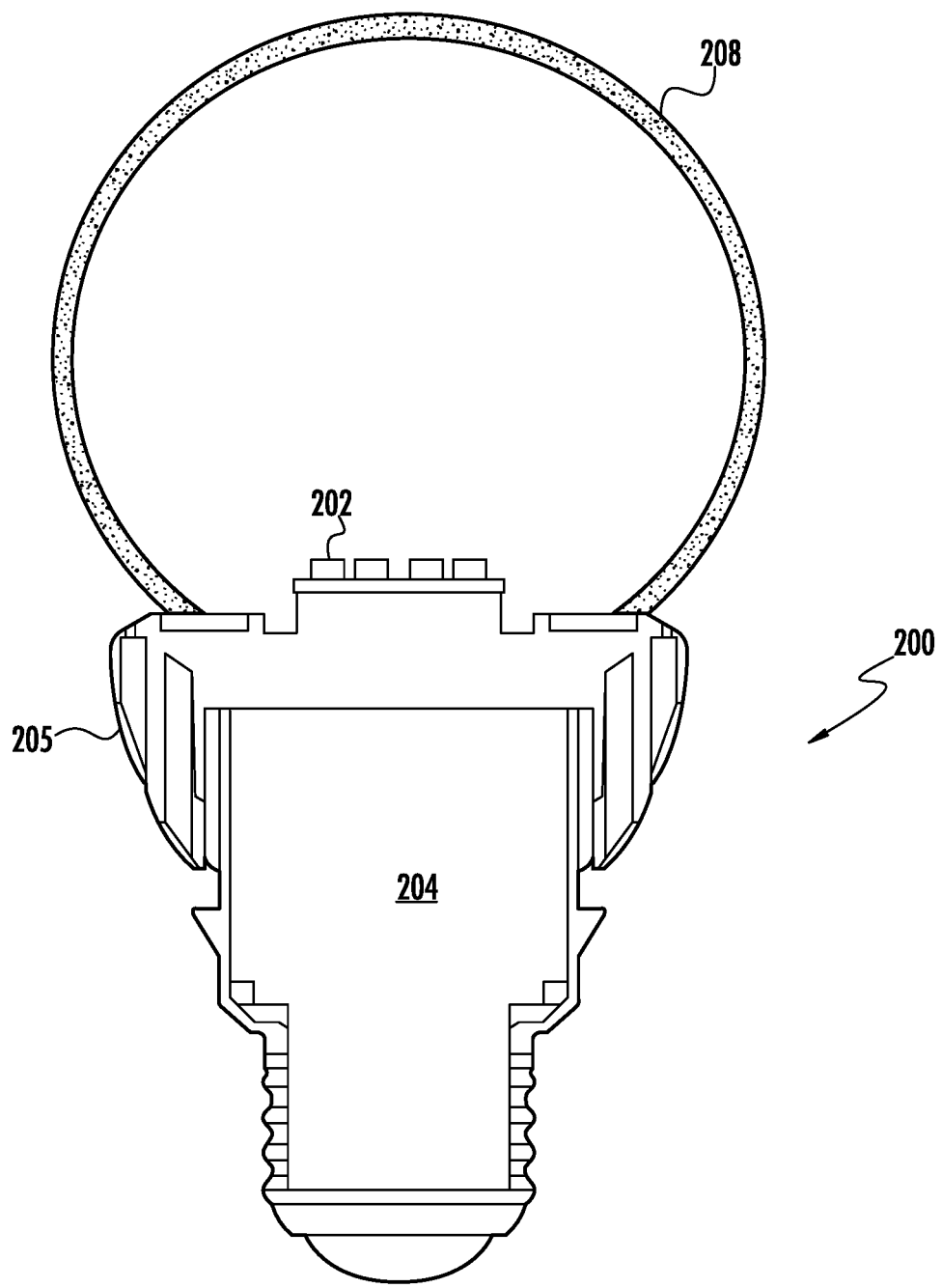
FIG. 2 is a cross-sectional view of an LED lamp according to some embodiments of the invention.

FIG. 2 is a cross-sectional view of a finished LED lighting system according to example embodiments of the present invention. The LED lighting system of FIG. 2 is configured as a lamp 200 and includes an LED assembly including a plurality of LED devices 202 and power supply 204. The power supply is conventional in nature and so details are not shown. Cooling for both the LED devices and power supply 204 is enhanced by heatsink 205. Lamp 200 includes optical element 208 to protect some of the other lamp components and provide direction and/or diffusion for the light from the lamp. Optical element 208, in this embodiment, is essentially a light transmissive globe. Optical element 208 can be made of glass or plastic.

In the example of FIG. 2, a glass optical element like that shown in FIG. 1 is being used in lamp 200. Due to neodymium oxide in the glass, light passing through the dome of optical element 208 is filtered so that the light exiting the dome exhibits the spectral notch previously described. The various additional portions of the LED lamp 200 according to example embodiments of the invention can be made of any of various materials. The heat sink can be made of metal, as can the various portions of the housings for the components of the lamp. Plastic with enhanced thermal conductivity can also be used to form the heat sink, and various plastics and polymers can be used for other portions of the lamp as well.

A lamp like that shown in FIG. 2 can be made with or without an internal structure to carry a phosphor to provide wavelength conversion. The size of optical element 208 can vary widely. In the example of FIG. 2, the optical element includes a lip that rests in spaces in the top of heatsink 205. The optical element can then be fastened in place with thermal epoxy. Other fastening methods can be used to fasten an optical element to the other parts of the lamp. As examples, globes can be threaded and can screw into or onto the lamp. A tab-and-slot or similar mechanical arrangement could be used, as could fasteners such as screws or clips.

Still referring to FIG. 2, blue or violet LEDs can be used in the lamp and the appropriate phosphor can be used with an optional internal carrier or globe and energized to create white light. LED devices can be used with phosphorized coatings packaged locally with the LEDs to create various colors of light which can then be mixed and combined to emit white light, which is then notch filtered by optical element 208 to create substantially white light. Example embodiments of a lamp like that shown in FIG. 2 can produce light with a CRI of at least 84, at least 89, or at least 91. By use of the term substantially white light, one could be referring to a chromaticity diagram including a blackbody locus of points, where the point for the source falls within four, six or ten MacAdam ellipses of any point in the blackbody locus of points. It should be noted that although neodymium oxide is used as an example rare earth element herein, other rare earth elements could be used to introduce notch-filtering properties. Other examples include didymium, dysprosium, erbium, holmium, praseodymium and thulium.

Figure 3:
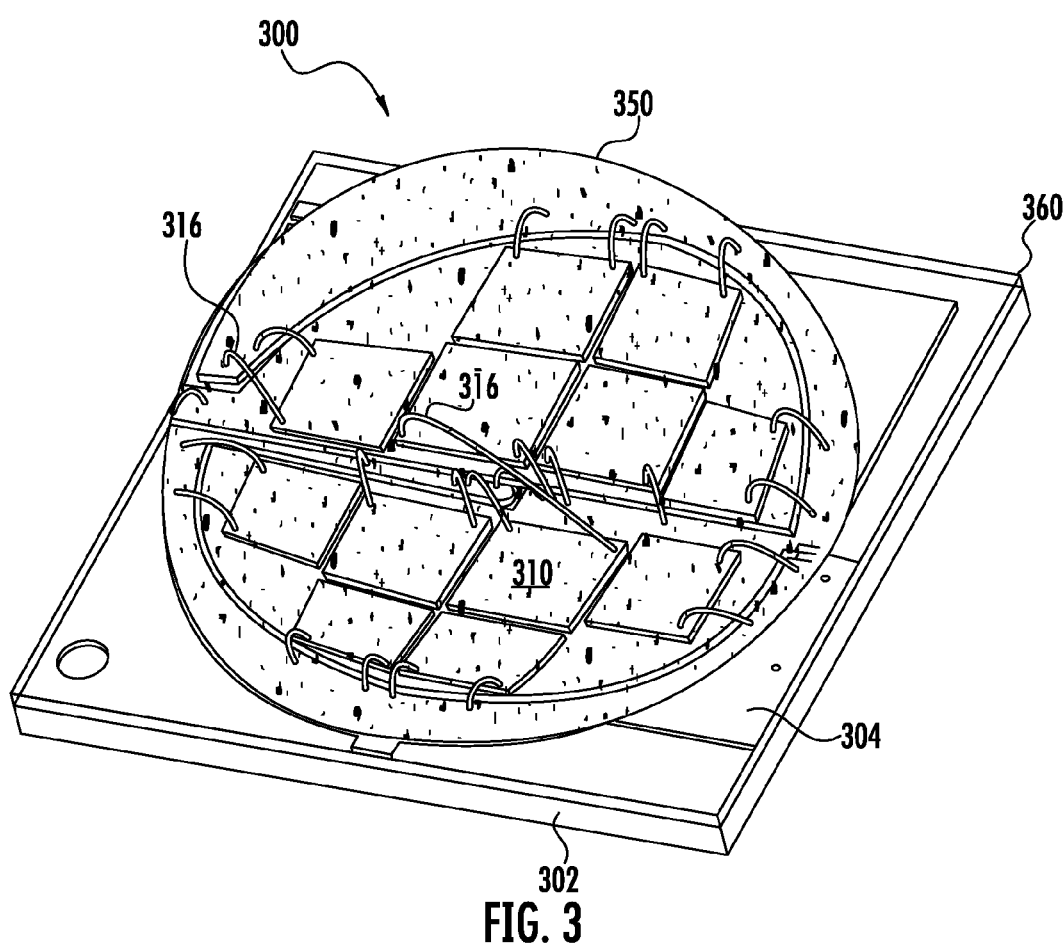
FIG. 3 is a perspective view of an LED device according to some example embodiments of the invention.

FIG. 3 is a perspective view of an LED device 300 according to some example embodiments of the invention. LED device 300 makes use of submount 302 with a pattern of metal 304 to provide some of the interconnections between the LED chips, other possible components such as ESD protection diodes (not visible) and an external power supply. LED device 300 includes twelve LED chips 310 fastened to metal layer 304. The anodes are on the bottom of the LED chips 310 and are in contact with metal layer 304 and the cathodes of the LED chips are connected by wire bonds 316 to portions of metal 304 on submount 302. The LED chips of LED device 300 of FIG. 3 can be fastened to the submount with conductive adhesive, solder, a welding process, or in any of various other ways. As before, the device is completed with an optical element placed on top of the device to affect light from the LED chips. A phosphor can be applied to or encapsulated with all or some of the LED chips.

Still referring to FIG. 3, the LED chips in device 300 may be selected from various light color bins to provide a combined light output with appropriate color characteristics for a desired application. The unfiltered efficiency of such an LED device with a warm white color, often desired for incandescent replacement lighting, may be as much as about 100 lm/W, prior to any filtering from the optical element. However, if the device is binned for a cool white color, an efficiency of as much as about 150 lm/W can be achieved, again prior to filtering. The design of the LED device of FIG. 3 can be adapted so that various types of LED chips could be used, such as direct-bond chips, flip-chips, and chips with substrates made of sapphire, silicon carbide, silicon or other materials.

Staying with FIG. 3 the optical element, lens 350 is visible over the two groups of six LED chips and submount 302. The distortion introduced by the lens can also be seen. A lens for use with an LED device of an embodiment of the invention may be made of glass or plastic, may be molded in place or elsewhere, or otherwise formed or attached to the device as desired. For example, the lens may be molded in place from silicone. In the example of FIG. 3, the lens is formed with a square flat portion 360 that covers the submount to align the lens and aid in assembling the device. Lens 350 of device 300 includes a rare earth compound as previously discussed, so that light passing through the lens is filtered to enable the light emitted by component 300 to exhibit a spectral notch. This notch filtering of the light enables the component in some embodiments to exhibit the relatively high CRI previously described.

Figure 4:
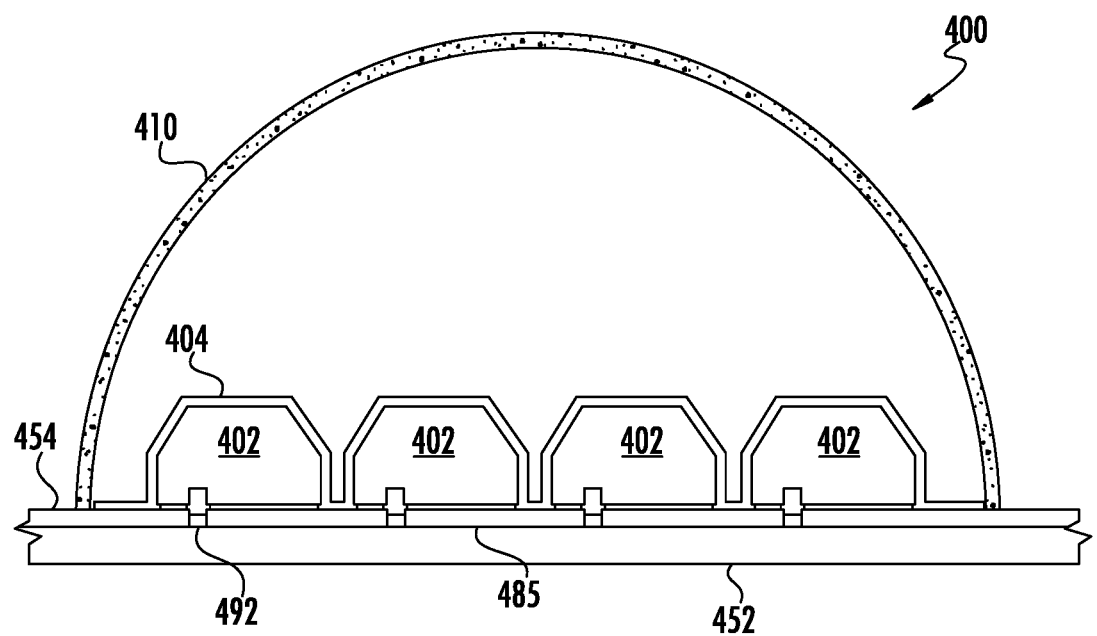
FIG. 4 is a cross-sectional view of another LED device according to some example embodiments of the invention.

FIG. 4 shows another illustrative LED device 400. The device of FIG. 4 is shown in cross-section, and includes "flip-chip" LEDs, with both anode and cathode connection pads on the bottom. In this example, some or all of LED dies 402 can include a conformal phosphor layer 404. If all LED devices are to include phosphor, the phosphor layer 404 is continuous as shown in this example. In some example embodiments, the phosphor layer's thickness is less than half the spacing between adjacent die. Device 400 includes lens 410 as an optical element, which again is doped, coated, or otherwise includes a neodymium compound so that, as previously discussed, light passing through the lens is filtered to enable the light emitted by component 400 to exhibit a spectral notch. This notch filtering of the light enables the component in some embodiments to exhibit the relatively high CRI previously described.

Still referring to FIG. 4, submount 452 is covered with a pattern of metal 454 to interconnect the LEDs if necessary and provide connection to a power supply. The metal pattern includes connection pads 485 with insulative material 492 in between. This particular pattern connects the LEDs visible in this view in series, but other connection schemes may be used depending on the desired operating characteristics of the device. Connecting LEDs in series produces a relatively high-voltage device, which may be desirable in some applications because power supply size can thus be minimized. As before, other components, such as ESD protection diodes may be present on the submount. The submount for device 400, as well as the submount for previously illustrated device 300, may be made of alumina or aluminum nitride, with our without filler. Other materials, for example high-temperature polymers, could be used.

With regard to multichip LED devices according to embodiments of the invention, relatively small submounts may be provided for LED arrays with higher voltages where LED die bonding areas are more efficiently used to balance desired operating voltage with chip area. These factors can also be balanced with chip spacing to provide ease of manufacturing and less light absorption within a device. Spacing between chips may generally be on the order of 10 to 75 micrometers, although spacing as large as 150 or even 500 micrometers can be used in some embodiments.

Figure 5:
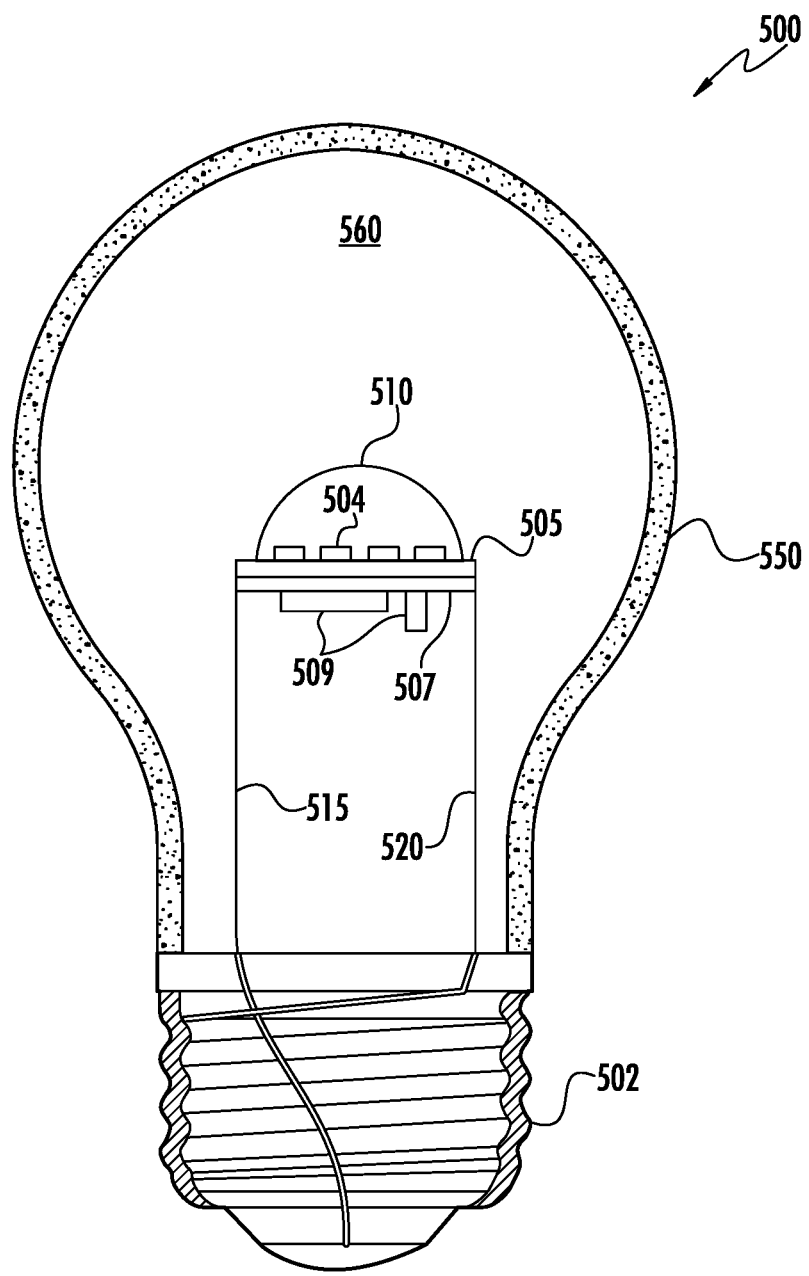
FIG. 5 is a cross-sectional view of an LED lamp according to additional example embodiments of the invention.

FIG. 5 is a cross-sectional view of an LED lighting system according to further embodiments of the invention. The LED lighting system of FIG. 5 is configured as a lamp, 500, which is an A-series lamp with an Edison base 502. In this case, LEDs 504 reside within an LED device 505 similar to the multichip devices previously described. The LED submount is mounted on a circuit board 507, which includes power supply components 509. Multichip LED device 505 includes a silicone lens 510, however, an embodiment could be designed in which bare or phosphor-coated LED die are used without a lens. Circuit board 507 is connected to the contacts in Edison base 502 via wires 515 and 520, and the electrical connections to supply power to the LED device from the power supply are self-contained in circuit board 507.

Still referring to FIG. 5, optical element 550 is an optical enclosure that surrounds the circuit board and the LED device. The optical enclosure is filled with an optically transmissive fluid medium 560. Additionally, the optical enclosure includes a rare earth compound that gives the enclosure spectral notch-filtering properties as previously discussed, and as indicated schematically by the pattern shown within the thickness of the optical enclosure in the drawing. It should be noted that a lamp like that shown in FIG. 5 could be constructed with the notch-filtering optical element as part of the LED device and a plain diffusion element as the external enclosure. A notch-filtering reflective element could also be used.

With respect to the fluid medium used with an embodiment of the invention, as an example, a liquid, gel, or other material that is either moderate to highly thermally conductive, moderate to highly convective, or both, can be used. As used herein, a "gel" includes a medium having a solid structure and a liquid permeating the solid structure. A gel can include a liquid, which is a fluid. The term "fluid medium" is used herein to refer to gels, liquids, and any other formable material. The fluid medium surrounds the LEDs or LED device or package in the optical enclosure. In example embodiments, the fluid medium is nonconductive. In example embodiments, the fluid medium has low to moderate thermal expansion, or a thermal expansion that substantially matches that of one or more of the other components of the lamp. The fluid medium in at least some embodiments is also inert and does not readily decompose.

As examples, a fluid medium used with an embodiment of the invention can be mineral oil. The fluid medium in some embodiments may also be a perfluorinated polyether (PFPE) liquid, or other fluorinated or halogenated liquid, or gel. An appropriate propylene carbonate liquid or gel having at least some of the above-discussed properties might also be used. Suitable PFPE-based liquids are commercially available, for example, from Solvay Solexis S.p.A of Italy. Flourinert™ manufactured by the 3M Company in St. Paul, Minn., U.S.A. can also be used. It should also be noted that in addition to being used in a lamp, a fluid medium could be used inside the lens or optical element of a multichip package, such as the type shown in FIG. 3, FIG. 4 or FIG. 5.

In at least some embodiments, the optically transmissive fluid medium is an index matching medium that is characterized by a refractive index that provides for efficient light transfer with minimal reflection and refraction from the LEDs through the enclosure. The index matching medium can have the same refractive index as the material of the enclosure, the LED device package material or the LED substrate material, especially if bare LED dies are used inside a lamp so that the fluid medium comes in contact with the substrate. The index matching medium can have a refractive index that is arithmetically in between the indices of two of these materials.

Various methods and techniques can be used to increase the capacity and decrease the size of a power supply, also sometimes called a "driver," in order to allow the power supply for an LED lamp to be manufactured more cost-effectively, or to take up less space in order to practically realize a lamp or LED device according to example embodiments of the invention. For example, a multichip LED device can be configured to be a high-voltage device as previously described. Additionally, energy storage methods can be used in the driver design. For example, current from a current source can be coupled in series with the LEDs, a current control circuit and a capacitor to provide energy storage. A voltage control circuit can also be used. A current source circuit can be used together with a current limiter circuit configured to limit a current through the LEDs to less than the current produced by the current source circuit. In the latter case, the power supply can also include a rectifier circuit having an input coupled to an input of the current source circuit.

Some embodiments of the invention can include a string of LED sets coupled in series, each set including at least one LED. The power supply in such an embodiment can include a plurality of current diversion circuits, respective ones of which are coupled to respective nodes of the string and configured to operate responsive to bias state transitions of respective ones of the LED sets. In some embodiments, a first one of the current diversion circuits is configured to conduct current via a first one of the LED sets and is configured to be turned off responsive to current through a second one of the LED sets. The first one of the current diversion circuits may be configured to conduct current responsive to a forward biasing of the first one of the LED sets and the second one of the current diversion circuit may be configured to conduct current responsive to a forward biasing of the second one of the LED sets.

In some of the embodiments described immediately above, the first one of the current diversion circuits is configured to turn off in response to a voltage at a node of the string. For example a resistor may be coupled in series with the string and the first one of the current diversion circuits may be configured to turn off in response to a voltage at a terminal of the resistor. In some embodiments, for example, the first one of the current diversion circuits may include a bipolar transistor providing a controllable current path between a node of the string and a terminal of a power supply, and current through the resistor may vary an emitter bias of the bipolar transistor. In some such embodiments, each of the current diversion circuits may include a transistor providing a controllable current path between a node of the string and a terminal of a power supply and a turn-off circuit coupled to a node of the string and to a control terminal of the transistor and configured to control the current path responsive to a control input. A current through one of the LED sets may provide the control input. The transistor may include a bipolar transistor and the turn-off circuit may be configured to vary a base current of the bipolar transistor responsive to the control input.

Figure 6:
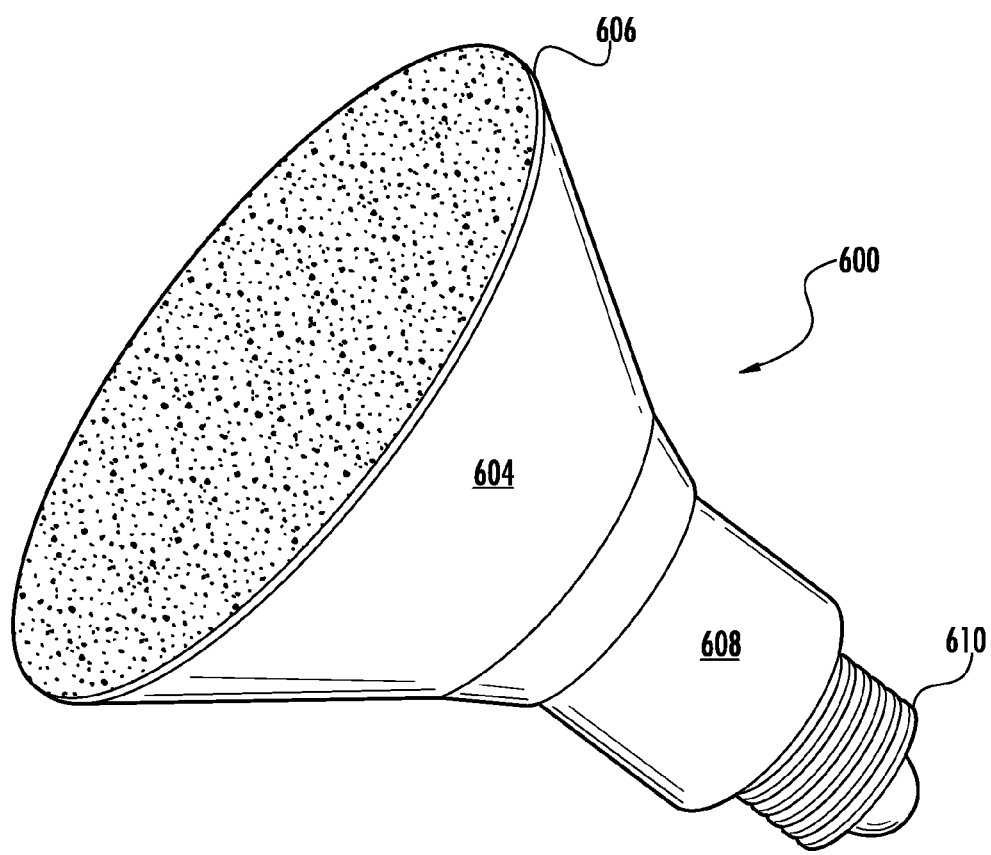
FIG. 6 is a perspective view of another LED lamp according further example embodiments of the present invention.

FIG. 6 is a perspective view of another LED lighting system, PAR-style lamp 600 that can serve as a replacement for a PAR-38 incandescent bulb. Lamp 600 includes a reflector 604 and a glass or plastic lens 606, which covers the front of lamp 600. In this case, the power supply (not shown) can be housed in base portion 608 of lamp 600. Lamp 600 includes an Edison base 610. Reflector 604 and lens 606 together form a light transmissive optical enclosure for the lamp, albeit light transmission in this case is directional. Note that a lamp like lamp 600 could be formed with a unitary enclosure, appropriately shaped and silvered or coated on an appropriate portion to form a directional, optically transmissive enclosure.

Still referring to FIG. 6, lamp 600 includes LED devices or dies (not visible) as previously discussed, and may in some embodiments include an optically transmissive fluid medium within the optically transmissive enclosure as previously discussed. As in other cases, lens 606 is an optical element of the lamp that is treated with a rare earth compound as schematically indicated by the fill pattern in the drawing. Light passing through the lens 606 of the lamp is filtered to enable the light emitted by lamp 600 to exhibit a spectral notch. This notch filtering of the light enables the lamp in some embodiments to again exhibit the relatively high CRI previously described. As an alternative, a PAR lamp like that shown in FIG. 6 could use a clear or diffusive lens and a notch-filtering reflector to improve CRI. The notch-filtering reflector can be constructed using a rare earth compound or compounds, an optical interference film as otherwise described herein, or a combination of the two.

It cannot be overemphasized that with respect to the features described herein with various example embodiments of a lighting system, the features can be combined in various ways. For example, the various methods of including phosphor in a system or device can be combined and any of those methods can be combined with the use of various types of LED arrangements such as bare dies vs. encapsulated or packaged LED devices. Additionally, lamps and fixtures can be constructed in any of various shapes and sizes. The embodiments shown herein are examples only, shown and described to be illustrative of various design options for a device or lamp using a notch-filtering optical element or lens.

Figure 7:
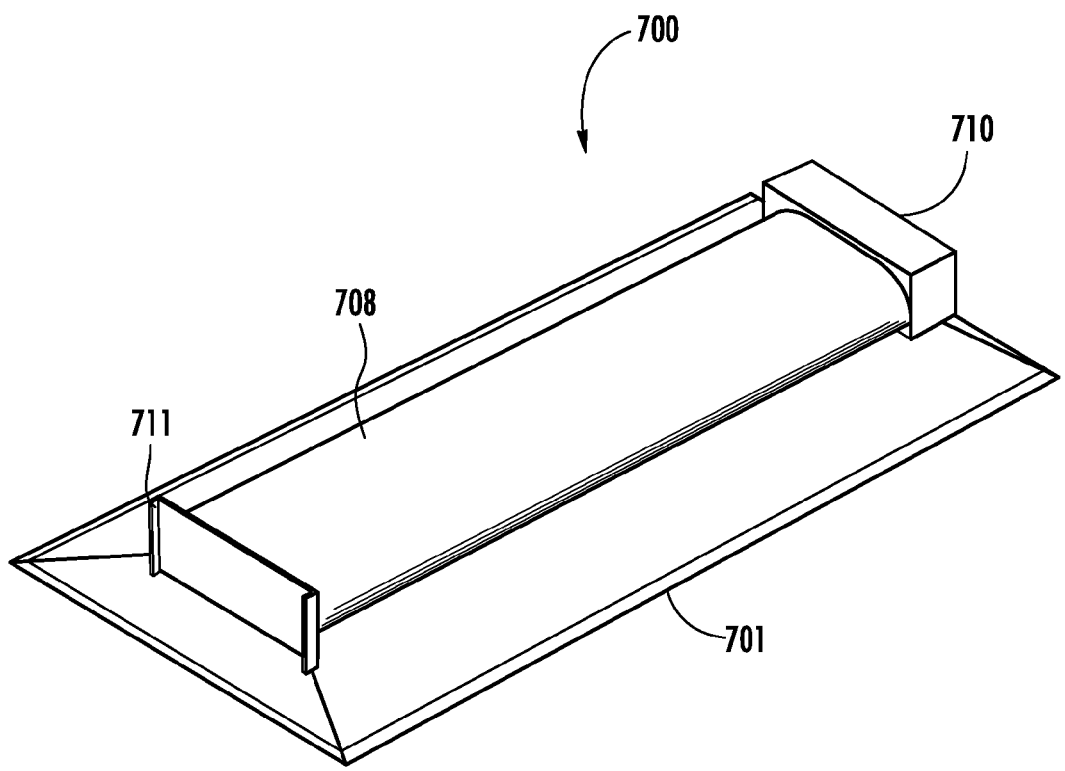
FIG. 7 is a perspective view of a fixture in which notch filtering of light is provided by a reflecting optical element rather than a transmissive optical element.
Figure 8:
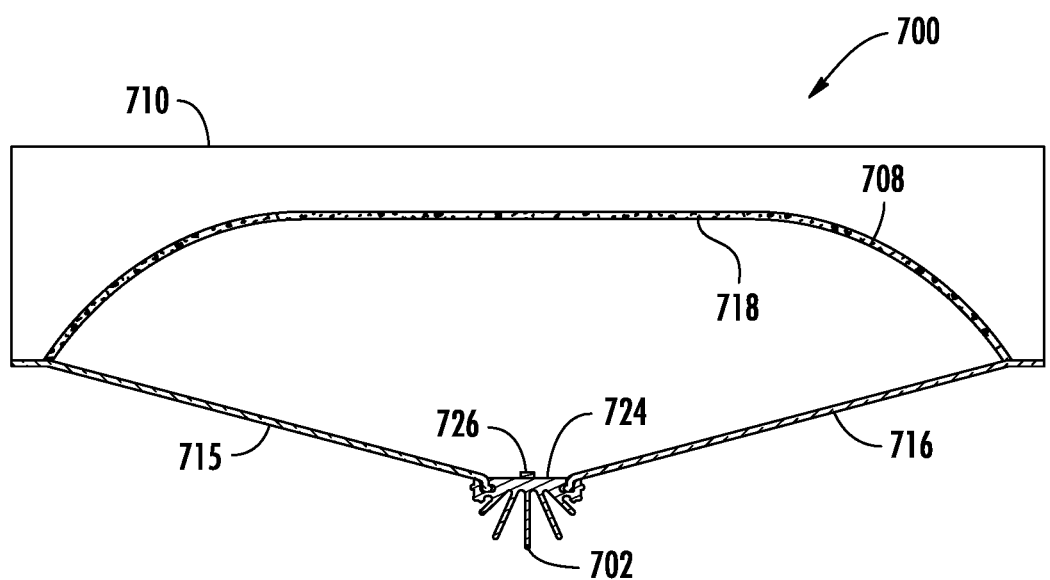
FIG. 8 is a cross-sectional view of the fixture of FIG. 7, in which notch-filtering is provided by a reflecting optical element.

FIG. 7 is a top perspective view of a lighting system and FIG. 8 is a cross-sectional view of a lighting system according to example embodiments of the invention. The lighting system of FIGS. 7 and 8 is configured as a light fixture 700 that makes use of spectral notching as previously described, but in this case the filtering element is applied to or included in a linear reflector to cause the light emitted from the light fixture to exhibit a spectral notch and thus have an improved CRI. Light fixture 700 is shown as a "troffer" style, in-ceiling linear light fixture as an example. However, embodiments of the invention can work with square or any of other various shapes and styles of LED fixtures. Light fixture 700 includes pan 701, heatsink 702, reflector 708 and end caps 710 and 711. End cap 710 is larger than end cap 711 and is shaped to act as a circuit box to house electronics used to drive and control the light source such as rectifiers, regulators, timing circuitry, and other components.

In the example of FIGS. 7 and 8, reflector 708 includes a flat region opposite the heat sink; however, a reflector for a troffer fixture according to embodiments of the invention can take various shapes. For example, reflector 708 could be parabolic in shape, or include two or more parabolic regions. Light fixture 700 also includes a diffuser lens assembly made up of two lens plates, 715 and 716, disposed at the sides of the heatsink. Reflector 708 can be made of many different materials, including metal plastic or paper or a material such as a microcellular polyethyleneterephthalate (MCPET) for example. Other reflective materials can also be used.

Still referring to FIGS. 7 and 8, reflector 708 is coated with a layer 718 that introduces notch-filtering when light is reflected from the reflector. The coating can include a rare earth compound of one the types already discussed, for example, neodymium oxide. The thickness of the coating in this diagram is not to scale and is exaggerated for clarity. As with the embodiments where a lens or enclosure provide the notch filtering for a lamp, the rare earth compound can be introduced into the reflector in other ways, for example, by impregnating into the surface or doping the material. Coating 718 in some embodiments can also be a film or films designed to filter light by introducing optical interference into the light path, or to cause the reflector to behave as a Bragg mirror. The notch filtering reflective surface is disposed opposite mounting surface 724 of heatsink 702, on which LED devices 726 are mounted, either directly, or on a circuit board which is in turn mounted on the heatsink. LED devices 726 form a linear LED array. Connecting wires from the power supply can be run through the heatsink or connections can be provided for as circuit board traces. It should be noted that a lighting system like that shown in FIGS. 7 and 8 could be designed to use notch-filtering lens plates instead of or in addition to the notch-filtering reflector already discussed.

LEDs and/or LED packages used with an embodiment of the invention and can include light emitting diode chips that emit hues of light that, when mixed, are perceived as white light. As previously suggested phosphors can be used to add yet other colors of light by wavelength conversion. For example, blue or violet LEDs can be used in a lamp and the appropriate phosphor can be included in any of the ways mentioned above. LED devices can be used with phosphorized coatings packaged locally with the LEDs or with a phosphor coating the LED die. A lighting system that, without notching, produces warm white or cool white light can work well with the notching introduced by neodymium oxide. Such parts can make use of two phosphors, for example, a calcium silicon nitride (CAS) red phosphor and/or a yttrium aluminum garnet (YAG) yellow. These phosphors can be excited by blue LEDs by including one and/or both phosphors in LED packages, on the LED die, or on a remote carrier.

The various parts of an LED lamp or light fixture according to example embodiments of the invention can be made of any of various materials. A lamp or fixture according to embodiments of the invention can be assembled using varied fastening methods and mechanisms for interconnecting the various parts. For example, in some embodiments locking tabs and holes can be used. In some embodiments, combinations of fasteners such as tabs, latches or other suitable fastening arrangements and combinations of fasteners can be used which would not require adhesives or screws. In other embodiments, adhesives, screws, bolts, or other fasteners may be used to fasten together the various components.

Figure 9:
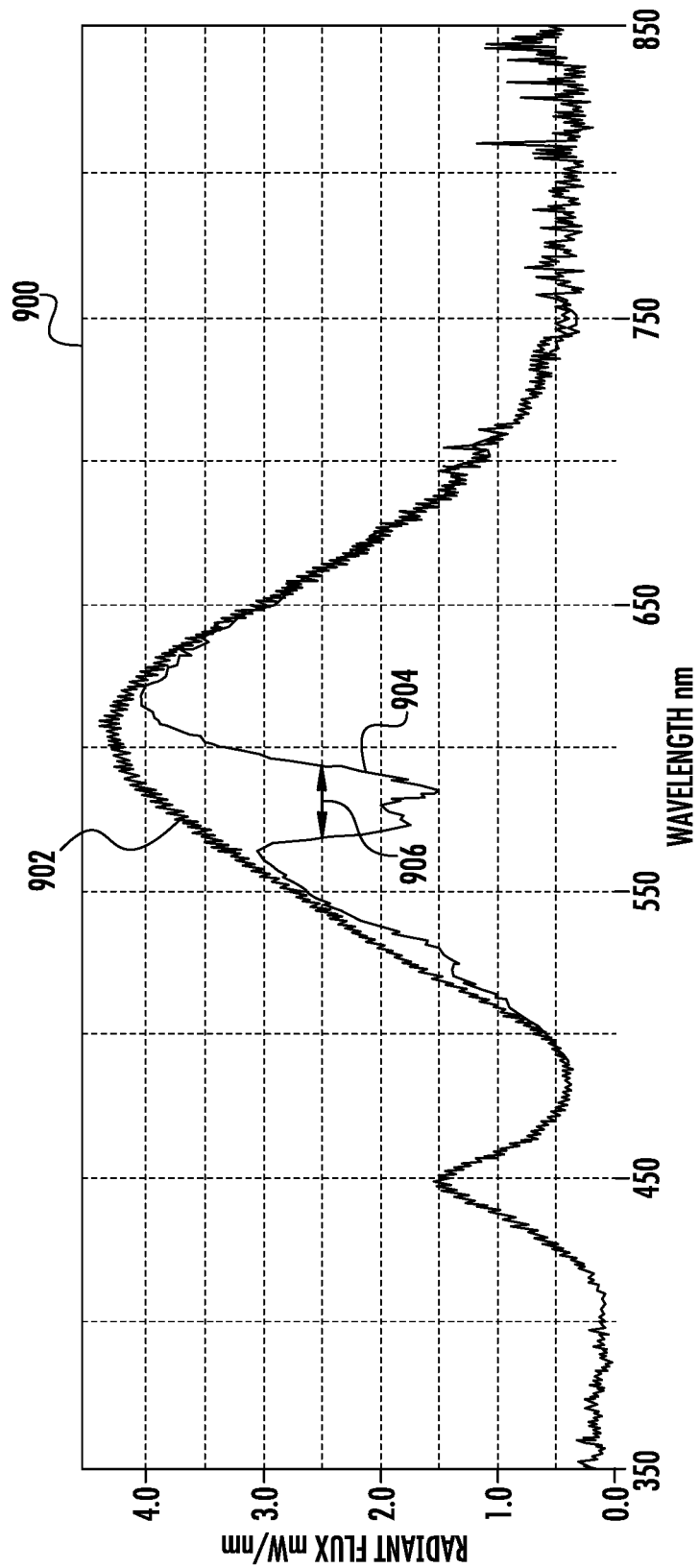
FIG. 9 is a graph illustrating the notch filtering properties of glass doped with a neodymium compound used with an LED device according to embodiments of the present invention.

FIG. 9 is a light intensity graph illustrating a spectral notch that has been discussed herein. Graph 900 shows radiant flux on the vertical axis and wavelength of light in nanometers on the horizontal axis. Curve 902 is a plot of measurements taken of the light output of an LED lamp constructed of a high-voltage multichip LED component in a mineral-oil filled, plain glass enclosure. Curve 904 is a plot of measurements taken of the light output of an LED lamp that is the same in most respects, except that the enclosure for the lamp measured for curve 904 is neodymium oxide doped glass. The notch where radiant flux is lower is clearly visible between the wavelengths of 550 nm and 600 nm.

It should be noted that throughout this disclosure, various filtering characteristics of optical elements are discussed using specific engineering terminology, and some of the concepts involved can be illustrated with graphs like that shown in FIG. 9 and the following figures. As an example, consider measurement 906 of FIG. 9. This measurement represents the width of the notch corresponding to the comparative reduction in light intensity at half the maximum reduction caused by the notch, otherwise known from the field of signal processing as the full width at half the maximum (FWHM). Of course peak attenuation or reduction of light intensity at the peak of the notch is also a significant characteristic. Another characteristic of a notch filter that is applicable can be referred to herein as the "shape profile" of the notch introduced by the filter. Again, from signal processing parlance, the shape profile is determined by Q-factor, and/or depth, and/or fall-off. Essentially, by shape profile what is meant is whether the notch is "soft" as in broad with gentle slopes, or "hard" as in more of a true "notch" in the generic sense, with steep sides.

Figure 10:
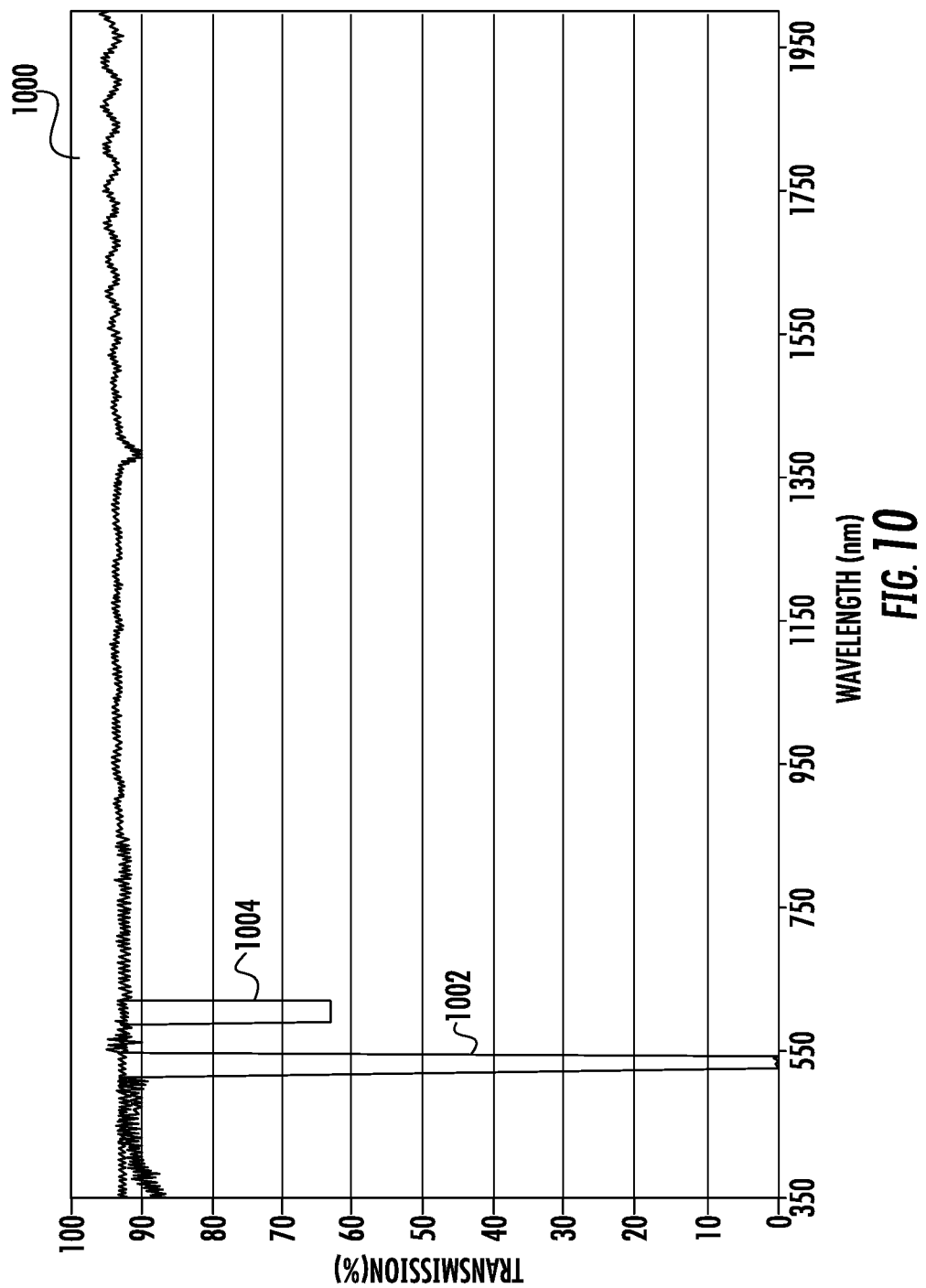
FIG. 10 is another graph illustrating notch filtering at a different frequency than that shown in FIG. 9 as the result of using a different type of optical treatment.

FIG. 10 is a light intensity graph that illustrates additional concepts related to embodiments of the invention. Graph 1000 shows radiant flux for a lighting system on the vertical axis and wavelength of light on the horizontal axis. In this particular example, notch-filtering is again shown with notch 1002, however this notch exhibits more attenuation and a different center wavelength than what has been previously shown for the case of neodymium oxide doping. Notch 1002 also has a "hard" shape profile, and a peak attenuation at or near 100%. Notch 1002 has a center wavelength of 532 nm. Notch 1004 is a notch like that previously described, which is shown on the graph for comparison purposes. Notch 1002 in FIG. 10 is introduced in a reflective application by applying an optical interference film coating, essentially causing a reflector to filter light. Such coatings are commercially available, as an example, from Rugate Technologies, Inc., of Oxford, Conn. in the United States. It should be noted that filtering by optical interference can be accomplished in other ways as well, for example, by coating or impregnating an optical elements with microparticles or nanoparticles of a particular geometric shape.

FIG. 10 also begins to illustrate that notch filtering can be applied to LED lighting system in various ways in that the notch can be tuned to various wavelengths and attenuation and fall-off can be adjusted for desired lighting characteristics. Spectral notches can be introduced at any wavelength within or outside the ranges discussed herein. The various rare earth compounds discussed that can be used for doping reflector and enclosure materials and the films discussed each have their own characteristics regarding notch location and depth. These various compounds and techniques can also be combined to achieve multiple notches if desired.

Figure 11:
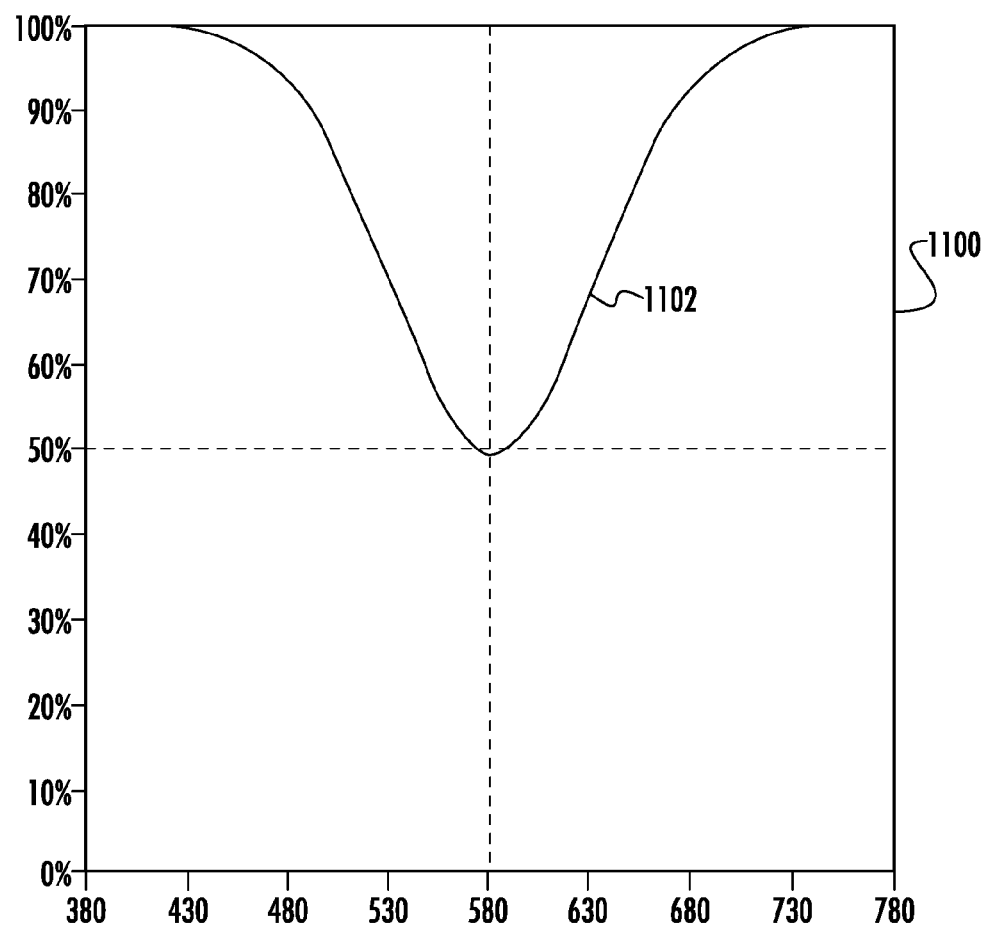
FIG. 11 is another graph illustrating the notch filtering properties of an optical element with a color pigment.

FIG. 11 illustrates a graph 1100 of the response of an optical notch filtering optical element according to additional embodiments of the invention. In this example, filtering is accomplished by yet another method, the inclusion of a color pigment in or on the optical element. As with the use of rare earth compounds, the use of color pigment can impart notch filtering properties in wither transmissive or reflective applications. In this case, notch 1102 is a softer notch with a peak attenuation of about 50% and a frequency of about 580 nm. This notch has been introduced by use of ultramarine pigment based on $CoAl_2O_4$. A cobalt blue pigment of similar composition could also be used. Other color pigments based on $CuSO_4$ or $NiCl_2$ can also be used. A variety of both natural and synthetic pigments are available and could be used to create a notch filtering optical element or optical notch filter according to embodiments of the invention.

It cannot be overemphasized that the positions and characteristics of the "notch" or notches used in optical notch filtering as discussed herein vary widely, have differing effects, and can be changed and adjusted via different optical designs to achieve a desired result, and depending on the specifics of the light source. Various phosphors and combinations of phosphors can be used with LEDs of various colors, and even if substantially white light with high CRI is the goal, the notch characteristics may need to be adjusted according to the light source as well as the desired output of the lamp or fixture. For example, warm white LED devices can include a mix of yellow and green phosphor and/or a red/orange phosphor excited by a blue LED. The CRI of such a system with no additional filtering can range between 75 and 85. Notch filtering as described herein can increase CRI (also referred to as $R_a$) by more than ten points in one example. The color quality scale (CQS) and the gamut area index (GAI) are improved as well, with rendering of red (also referred to as R9) being increased, although efficacy and light output can be reduced. Results vary with different combinations of phosphors.

As an example of the above, the YAG and CAS phosphors previously mentioned come in various known formulations, each with as specific designation, and each with slightly different color characteristics. Using neodymium oxide doped glass as a notch filtering optical element, with a combination of CASN1 and Y108 phosphors and a blue LED, CRI can increase from 84 to 90, R9 can increase from 36 to 84, total CQS can increase from 81 to 85 and gamut area index (GAI) can increase from 50 to 58. This is one example only.

Figure 12A:
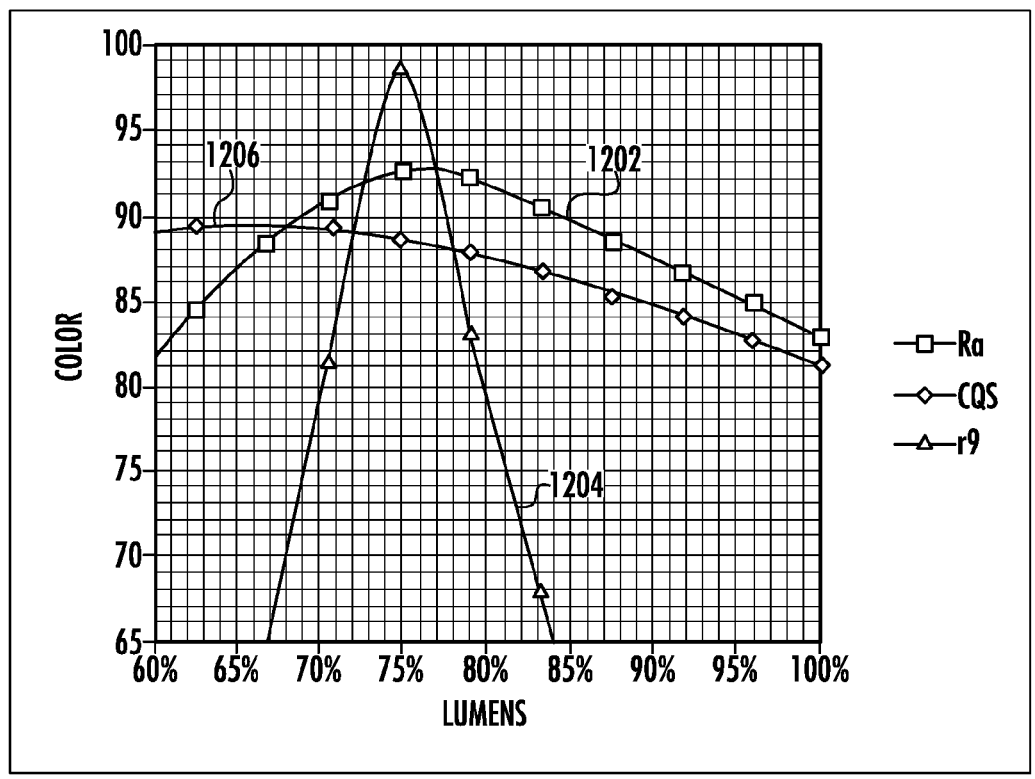
FIGS. 12A and 12B are graphs illustrating properties such as color rendering index (CRI) color quality scale (CQS) relative to notch depth with some example embodiments of the invention.
Figure 12B:
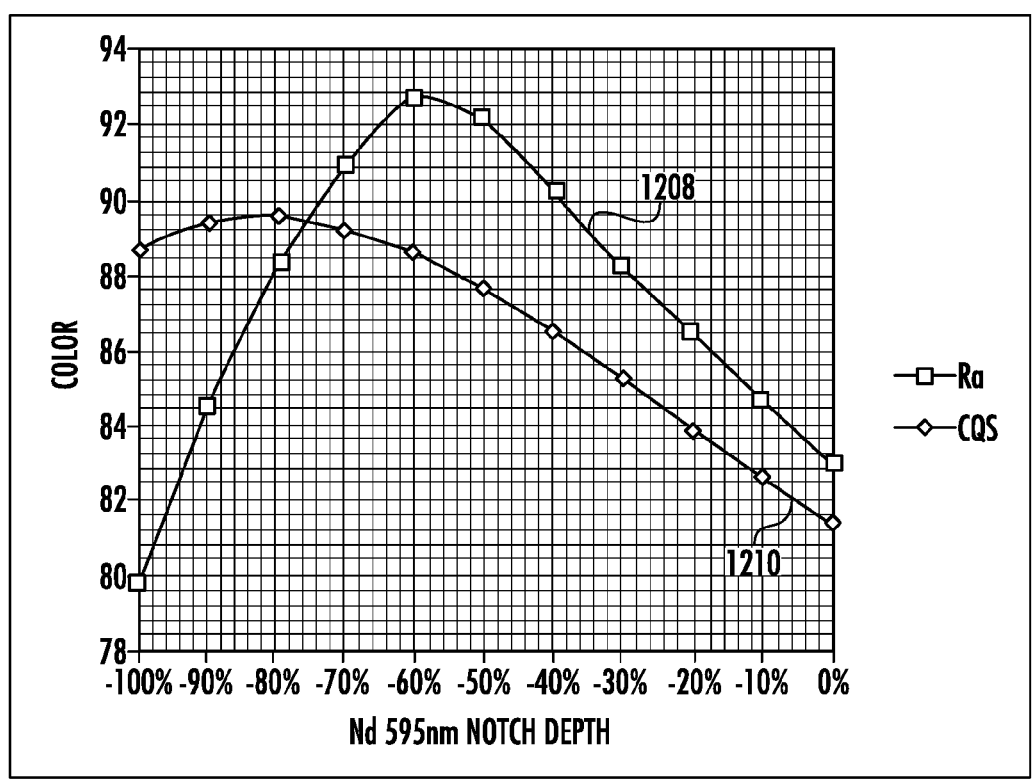

FIGS. 12A and 12B are graphs that show curves for $R_a$, R9 and CQS, for a CASN1/Y108 LED light source with a neodymium oxide doped optical element. These curves illustrate the interaction of these factors with light output based on notch depth. FIG. 12A illustrates all three relative to reduction in lumens output by an LED bulb as adjusted by varying the depth of the notch. If CRI ($R_a$), represented by curve 1202, and R9 output, represented by curve 1204 are maximized, output is reduced by about 25%, or to about 75% relative to unfiltered output. Note that if CQS, represented by curve 1206 is maximized, output is reduced even further. FIG. 12B plots CRI ($R_a$) and CQS directly vs. notch depth. A notch depth of about 60% maximizes CRI as shown by curve 1208 and a notch depth of about 82% maximizes CQS.

It should be further noted that the effect of the notch filter is, at least in part, produced by the width of the notch integrated with its depth. A very narrow (high Q) notch needs to be deep (produce strong attenuation at its center wavelength) to achieve a similar effect to a wider notch with a shallower depth. A notch with a center wavelength closer to red will have less effect on total output of the bulb or fixture. Also, the center wavelength of the notch filter can be complementary to the amount blue excitation from the LED(s) for maximum CRI and GAI in a blue-LED system.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

The invention claimed is:
1. A LED lighting apparatus comprising:
a base including multiple electrical contacts;
a LED device including a submount, at least one LED arranged on or over the submount, and a lens arranged to transmit light emitted by the at least one LED, the LED device emitting visible light;
a body arranged between the base and the LED device;
a light-transmissive optical enclosure including an edge arranged proximate to the body, including a distal end arranged distal from the body, and defining an interior containing the LED device, wherein the optical enclosure is remotely located from the LED device, and the submount is arranged at an elevated position within the interior between the edge and the distal end,
the LED lighting apparatus is embodied in a LED light bulb, wherein the optical enclosure is arranged along an external surface of the LED light bulb; and the optical enclosure comprises a notch filtering material configured to receive at least some light generated by the LED device to cause emissions of the LED light bulb to exhibit a spectral notch with a portion of the visible spectrum after being affected by the notch filtering material.

2. The LED lighting apparatus of claim 1, wherein the spectral notch occurs between the wavelengths of 520 nm and 605 nm.

3. The LED lighting apparatus of claim 1, wherein the spectral notch occurs between the wavelengths of 565 nm and 600 nm.

4. The LED lighting apparatus of claim 1, wherein the spectral notch occurs between the wavelengths of 570 nm and 595 nm.

5. The LED lighting apparatus of claim 1, wherein the notch filtering material comprises a rare earth compound.

6. The LED lighting apparatus of claim 1, wherein light emitted from the LED light bulb exhibits a color rendering index (CRI) of at least 84.

7. The LED lighting apparatus of claim 6, wherein the light emitted from the LED light bulb exhibits a CRI of at least 89.

8. A method of assembling a LED lighting apparatus according to claim 1 wherein the at least one LED comprises a plurality of LED chips, the method comprising:
selecting the plurality of LED chips based on desired light output characteristics;
interconnecting the plurality of LED chips; and
positioning the optical enclosure to affect light emitted by the plurality of LED chips, wherein the optical enclosure filters the light emitted by the plurality of LED chips to exhibit a spectral notch.

9. The method of claim 8 further comprising adding a color pigment other than a rare earth compound to at least one of glass, plastic, and silicone to produce the optical enclosure.

10. The method of claim 8 further comprising adding phosphor material to receive at least a portion of emissions of at least some LED chips of the plurality of LED chips.

11. The method of claim 8 wherein the optical enclosure comprises at least one of glass, plastic, and silicone, and the method comprises adding at least one of (i) a color pigment other than a rare earth compound or (ii) a rare earth compound to the at least one of glass, plastic, and silicone.

12. The method of claim 11 wherein the method comprises adding a rare earth compound to the at least one of glass, plastic and silicon, and the rare earth compound comprises at least one of neodymium oxide, didymium, dysprosium, erbium, holmium, praseodymium, and thulium.

13. The method of claim 12, further comprising placing an optically transmissive fluid medium comprising a liquid in the optical enclosure so as to be thermally coupled to the plurality of LED chips, wherein the liquid remains in a liquid state when the plurality of LED chips is operated to aid in cooling the plurality of LED chips.

14. The LED lighting apparatus of claim 1, wherein light intensity is comparatively reduced by the optical enclosure within a predetermined portion of a visible spectrum of light generated by the at least one LED.

15. The LED lighting apparatus of claim 14, further comprising at least one phosphor, and wherein the light generated by the at least one LED includes emissions of the at least one LED in combination with emissions of the at least one phosphor.

16. The LED lighting apparatus of claim 15, wherein the light intensity is comparatively reduced by a peak amount of about 75%.

17. The LED lighting apparatus of claim 15, wherein the light intensity is comparatively reduced by a peak amount of about 50%.

18. The LED lighting apparatus of claim 15, wherein the light intensity is comparatively reduced by a peak amount of between 5% and about 100%.

19. The LED lighting apparatus of claim 18, wherein a full width of the spectral notch corresponding to the comparative reduction at half maximum intensity is about 10 nm and wherein a color rendering index (CRI) of emissions of the LED light bulb is at least about 84.

20. The LED lighting apparatus of claim 19, wherein a center wavelength for the spectral notch is between 580 and 600 nm.

21. The LED lighting apparatus of claim 18, wherein a full width of the spectral notch corresponding to the comparative reduction at half maximum intensity is about 20 nm and wherein a color rendering index (CRI) of emissions of the LED light bulb is at least about 91.

22. The LED lighting apparatus of claim 21, wherein a center wavelength for the spectral notch is between 580 and 600 nm.

23. The LED lighting apparatus of claim 18, wherein a full width of the spectral notch corresponding to the comparative reduction at half maximum is between 10 nm and 20 nm and a center wavelength for the spectral notch is between about 520 nm and about 605 nm.

24. The LED lighting apparatus of claim 23, wherein the spectral notch exhibits a predetermined shape profile.

25. The LED lighting apparatus of claim 23, wherein the notch filtering material comprises a rare earth compound.

26. The LED lighting apparatus of claim 23, wherein the notch filtering material comprises a color pigment other than a rare earth compound to produce the spectral notch.

27. The LED lighting apparatus of claim 23, further comprising a reflector including a reflective material coated with an optical interference film.

28. A method of operating a LED lighting apparatus according to claim 1, the method comprising:
energizing the at least one LED; and
utilizing the optical enclosure to filter a visible light intensity so that the visible light intensity is comparatively reduced within a predetermined part of a spectrum of visible light and color rendering index (CRI) is improved.

29. The method of claim 28 wherein the CRI is improved by at least four points relative to a LED light bulb lacking an optical enclosure arranged to filter light emissions to produce the spectral notch.

30. The method of claim 29 wherein the visible light intensity is comparatively reduced by a peak amount between 25% and about 100%.

31. The method of claim 29 wherein the filtering of the visible light intensity comprises applying a spectral notch with at least one predetermined characteristic.

32. The method of claim 31 wherein the at least one predetermined characteristic comprises at least one of depth, width and shape profile.

33. The method of claim 29 wherein the filtering of the visible light intensity comprises passing light through the optical enclosure.

34. The method of claim 28 wherein the notch filtering material comprises a color pigment other than a rare earth compound to produce the spectral notch.

35. The LED lighting apparatus of claim 1, further comprising a circuit board to which are mounted driver components arranged to supply power to the LED device, wherein the LED device and the driver components are mounted to the circuit board, and wherein the driver components include at least one of a current control circuit, an energy storage element, a voltage control circuit, a rectifier circuit, and a current diversion circuit.

36. The LED lighting apparatus of claim 1, wherein the body comprises a heatsink, and the LED device is in conductive thermal communication with the heatsink.

37. The LED lighting apparatus of claim 1, wherein the base comprises a threaded Edison base.

38. The LED lighting apparatus of claim 1, wherein the optical enclosure comprises a curved globe including a maximum width at a position intermediately arranged between the edge and the distal end, and including a reduced width at the edge.

39. The LED lighting apparatus of claim 36, wherein the edge comprises a lip, and the lip is arranged in or on the heatsink.

40. A LED light bulb comprising:
a base including multiple electrical contacts;
a plurality of interconnected LED chips;
an optical enclosure arranged along an external surface of the LED light bulb, wherein the optical enclosure is remotely located from the plurality of interconnected LED chips and defines an interior containing the plurality of interconnected LED chips;
a circuit board including driver components arranged to supply power to the plurality of interconnected LED chips, wherein the driver components include at least one of a current control circuit, an energy storage element, a voltage control circuit, a rectifier circuit, and a current diversion circuit; and
at least one lens arranged to cover each LED of the plurality of interconnected LED chips, the interior of the optical enclosure containing an optically transmissive fluid medium comprising a liquid that is thermally coupled to the plurality of interconnected LED chips, the at least one lens being arranged between the plurality of interconnected LED chips and the fluid medium, with the liquid remaining in a liquid state when the plurality of interconnected LED chips are operated to aid in cooling the plurality of interconnected LED chips;
wherein the optical enclosure comprises a notch filtering material and is transmissive of at least a portion of light emitted by the plurality of interconnected LED chips while filtering the light to exhibit a spectral notch.

41. The LED light bulb of claim 40 wherein the spectral notch occurs between the wavelengths of 520 nm and 605 nm.

42. The LED light bulb of claim 41 wherein the spectral notch occurs between the wavelengths of 565 nm and 600 nm.

43. The LED light bulb of claim 42 wherein the spectral notch occurs between the wavelengths of 570 nm and 595 nm.

44. The LED light bulb of claim 40 wherein the optical enclosure comprises a rare earth compound.

45. The LED light bulb of claim 40 further comprising phosphor associated with at least one LED chip of the plurality of interconnected LED chips.

46. The LED light bulb of claim 45 wherein the light emitted by the LED light bulb exhibits a color-rendering index (CRI) of at least 84.

47. The LED light bulb of claim 46 wherein the light emitted by the LED light bulb exhibits a CRI of at least 89.

48. An LED lighting system comprising:
an LED array operable to emit light when energized through an electrical connection;
an optical element that filters the light to exhibit a spectral notch after being affected by the optical element;
a power supply connected to the LED array through the electrical connection; and
at least one lens arranged to cover each LED of the LED array;
wherein the optical element comprises an optical enclosure containing an optically transmissive fluid medium comprising a liquid that is thermally coupled to the LED array, the at least one lens is arranged between the LED array and the fluid medium, and the liquid remains in a liquid state when the LED array is operated to aid in cooling LED chips of the LED array.

49. The LED lighting system of claim 48 wherein the spectral notch occurs between the wavelengths of 520 nm and 605 nm.

50. The LED lighting system of claim 49 wherein the spectral notch occurs between the wavelengths of 565 nm and 600 nm.

51. The LED lighting system of claim 50 wherein the spectral notch occurs between the wavelengths of 570 nm and 595 nm.

52. The LED lighting system of claim 48 wherein the optical element comprises a color pigment other than a rare earth compound to produce the spectral notch.

53. The LED lighting system of claim 48 wherein the optical element further comprises a rare earth compound.

54. The LED lighting system of claim 48 wherein the optical enclosure contains the LED array, and wherein the optical enclosure embodies an external enclosure of a light bulb.

55. The LED lighting system of claim 54 wherein the light from the LED lighting system exhibits a color-rendering index (CRI) of at least 84.

56. The LED lighting system of claim 55 wherein the light from the LED lighting system exhibits a CRI of at least 89.

57. A LED lighting apparatus comprising:
a plurality of LED packages arranged on a mounting surface in conductive thermal communication with at least one heatsink, each LED package of the plurality of LED packages including at least one LED and a lens arranged to transmit light emitted by the at least one LED, the LED packages emitting visible light;
the LED lighting apparatus is embodied in a troffer-type LED ceiling fixture; and
the at least one heatsink is arranged to dissipate heat to an environment proximate to the troffer-type LED ceiling fixture;
wherein the LED lighting apparatus comprises at least one of the following features (a) or (b):
(a) a reflector spatially separated from the plurality of LED packages, the reflector comprising a reflective material coated with a notch filtering material configured to receive at least some light generated by the plurality of LED packages to cause emissions of the troffer-type LED ceiling fixture to exhibit a spectral notch within a portion of the visible spectrum after being affected by the notch filtering material; or
(b) at least one lens plate spatially separated from the plurality of LED packages, the at least one lens plate comprising a light transmissive material and a notch filtering material configured to receive at least some light produced by the plurality of LED packages to cause emissions of the troffer-type LED ceiling fixture to exhibit a spectral notch within a portion of the visible spectrum after being affected by the notch filtering material.

58. The LED lighting apparatus of claim 57, wherein each LED package of the plurality of LED packages includes a submount supported by the mounting surface, and the at least one LED of each LED package is arranged on or over the submount.

59. The LED lighting apparatus of claim 57, comprising a reflector spatially separated from the plurality of LED packages, the reflector comprising a reflective material coated with a notch filtering material configured to receive at least some light generated by the plurality of LED packages to cause emissions of the troffer-type LED ceiling fixture to exhibit a spectral notch after being affected by the notch filtering material.

60. The LED lighting apparatus of claim 57, comprising at least one lens plate spatially separated from the plurality of LED packages, the at least one lens plate comprising a light transmissive material and a notch filtering material configured to receive at least some light produced by the plurality of LED packages to cause emissions of the troffer-type LED ceiling fixture to exhibit a spectral notch after being affected by the notch filtering material.

61. The LED lighting apparatus of claim 57, wherein the notch filtering material comprises an optical interference film to produce the spectral notch.

\* \* \* \* \*